(12) United States Patent
Thor et al.

(10) Patent No.: US 11,073,413 B2
(45) Date of Patent: Jul. 27, 2021

(54) OPTICAL ENCODER AND INTERPOLATION CIRCUIT AND OPERATING METHOD THEREOF

(71) Applicant: PixArt Imaging Inc., Hsin-Chu County (TW)

(72) Inventors: Swee-Lin Thor, Penang (MY); Gim-Eng Chew, Penang (MY)

(73) Assignee: PIXART IMAGING INC., Hsin-Chu County (TW)

( * ) Notice: Subject to any disclaimer, the term of this patent is extended or adjusted under 35 U.S.C. 154(b) by 237 days.

(21) Appl. No.: 16/427,872

(22) Filed: May 31, 2019

(65) Prior Publication Data

US 2020/0166383 A1 May 28, 2020

Related U.S. Application Data

(60) Provisional application No. 62/771,278, filed on Nov. 26, 2018.

(51) Int. Cl.
| | |
|---|---|
| *H04L 7/00* | (2006.01) |
| *H03M 1/20* | (2006.01) |
| *H03K 5/24* | (2006.01) |
| *G01D 5/347* | (2006.01) |
| *H03K 5/13* | (2014.01) |
| *H03K 5/00* | (2006.01) |

(52) U.S. Cl.
CPC ............ *G01D 5/34715* (2013.01); *H03K 5/13* (2013.01); *H03K 5/24* (2013.01); *H03K 2005/00052* (2013.01); *H03K 2005/00286* (2013.01)

(58) Field of Classification Search
CPC ............ H03K 2005/0052; H03K 2005/00286; H03M 1/202; H03M 1/203; H03M 1/204; H03M 3/508; H04L 7/0029; H04L 7/002; H04L 7/0037; H04L 7/0041
See application file for complete search history.

(56) References Cited

U.S. PATENT DOCUMENTS 8,140,870 B2 * 3/2012 Hopkins ........... H02M 3/33576
713/300

* cited by examiner

*Primary Examiner* — An T Luu
(74) *Attorney, Agent, or Firm* — Hauptman Ham, LLP (57) ABSTRACT

There is provided an interpolation circuit of an optical encoder including a phase shifter circuit, two multiplexers, two digital circuits and four comparators. The phase shifter circuit receives signals sequentially have a 90 degrees phase shift and outputs multiple phase shifted signals. Each of the two multiplexers receives a half of the multiple phase shifted signals and outputs two pairs of phase shifted signals, each pair having 180 degrees phase difference, respectively to two comparators connected thereto. Each of the two digital circuits controls the corresponding multiplexer to select the two pairs of phase shifted signals from the half of the multiple phase shifted signals.

20 Claims, 8 Drawing Sheets

| comparator C1 | | |
|---|---|---|
| + | − | SW |
| sin0 | sin180 | YA0 |
| sin7.2 | sin187.2 | YA2 |
| sin14.4 | sin194.4 | YA4 |
| sin21.6 | sin201.6 | YA6 |
| sin28.8 | sin208.8 | YA8 |
| sin36.0 | sin216 | YA10 |
| sin43.2 | sin223.2 | YA12 |
| sin50.4 | sin230.4 | YA14 |
| sin57.6 | sin237.6 | YA16 |
| sin64.8 | sin244.8 | YA18 |
| sin72.0 | sin252 | YA20 |
| sin79.2 | sin259.2 | YA22 |
| sin86.4 | sin266.4 | YA24 |
| sin93.6 | sin273.6 | YA26 |
| sin100.8 | sin280.8 | YA28 |
| sin108.0 | sin288 | YA30 |
| sin115.2 | sin295.2 | YA32 |
| sin122.4 | sin302.4 | YA34 |
| sin129.6 | sin309.6 | YA36 |
| sin136.8 | sin316.8 | YA38 |
| sin144.0 | sin324 | YA40 |
| sin151.2 | sin331.2 | YA42 |
| sin158.4 | sin338.4 | YA44 |
| sin165.6 | sin345.6 | YA46 |
| sin172.8 | sin352.8 | YA48 |

| comparator C2 | | |
|---|---|---|
| + | − | SW |
| sin3.6 | sin183.6 | YA1 |
| sin10.8 | sin190.8 | YA3 |
| sin18.0 | sin198 | YA5 |
| sin25.2 | sin205.2 | YA7 |
| sin32.4 | sin212.4 | YA9 |
| sin39.6 | sin219.6 | YA11 |
| sin46.8 | sin226.8 | YA13 |
| sin54.0 | sin234 | YA15 |
| sin61.2 | sin241.2 | YA17 |
| sin68.4 | sin248.4 | YA19 |
| sin75.6 | sin255.6 | YA21 |
| sin82.8 | sin262.8 | YA23 |
| sin90.0 | sin270 | YA25 |
| sin97.2 | sin277.2 | YA27 |
| sin104.4 | sin284.4 | YA29 |
| sin111.6 | sin291.6 | YA31 |
| sin118.8 | sin298.8 | YA33 |
| sin126.0 | sin306 | YA35 |
| sin133.2 | sin313.2 | YA37 |
| sin140.4 | sin320.4 | YA39 |
| sin147.6 | sin327.6 | YA41 |
| sin154.8 | sin334.8 | YA43 |
| sin162.0 | sin342 | YA45 |
| sin169.2 | sin349.2 | YA47 |
| sin176.4 | sin356.4 | YA49 |

| comparator C3 | | |
|---|---|---|
| + | − | SW |
| sin1.8 | sin181.8 | YB0 |
| sin9.0 | sin189.0 | YB2 |
| sin16.2 | sin196.2 | YB4 |
| sin23.4 | sin203.4 | YB6 |
| sin30.6 | sin210.6 | YB8 |
| sin37.8 | sin217.8 | YB10 |
| sin45.0 | sin225.0 | YB12 |
| sin52.2 | sin232.2 | YB14 |
| sin59.4 | sin239.4 | YB16 |
| sin66.6 | sin246.6 | YB18 |
| sin73.8 | sin253.8 | YB20 |
| sin81.0 | sin261.0 | YB22 |
| sin88.2 | sin268.2 | YB24 |
| sin95.4 | sin275.4 | YB26 |
| sin102.6 | sin282.6 | YB28 |
| sin109.8 | sin289.8 | YB30 |
| sin117.0 | sin297.0 | YB32 |
| sin124.2 | sin304.2 | YB34 |
| sin131.4 | sin311.4 | YB36 |
| sin138.6 | sin318.6 | YB38 |
| sin145.8 | sin325.8 | YB40 |
| sin153.0 | sin333.0 | YB42 |
| sin160.2 | sin340.2 | YB44 |
| sin167.4 | sin347.4 | YB46 |
| sin174.6 | sin354.6 | YB48 |

| comparator C4 | | |
|---|---|---|
| + | − | SW |
| sin5.4 | sin185.4 | YB1 |
| sin12.6 | sin192.6 | YB3 |
| sin19.8 | sin199.8 | YB5 |
| sin27.0 | sin207.0 | YB7 |
| sin34.2 | sin214.2 | YB9 |
| sin41.4 | sin221.4 | YB11 |
| sin48.6 | sin228.6 | YB13 |
| sin55.8 | sin235.8 | YB15 |
| sin63.0 | sin243.0 | YB17 |
| sin70.2 | sin250.2 | YB19 |
| sin77.4 | sin257.4 | YB21 |
| sin84.6 | sin264.6 | YB23 |
| sin91.8 | sin271.8 | YB25 |
| sin99.0 | sin279.0 | YB27 |
| sin106.2 | sin286.2 | YB29 |
| sin113.4 | sin293.4 | YB31 |
| sin120.6 | sin300.6 | YB33 |
| sin127.8 | sin307.8 | YB35 |
| sin135.0 | sin315.0 | YB37 |
| sin142.2 | sin322.2 | YB39 |
| sin149.4 | sin329.4 | YB41 |
| sin156.6 | sin336.6 | YB43 |
| sin163.8 | sin343.8 | YB45 |
| sin171.0 | sin351.0 | YB47 |
| sin178.2 | sin358.2 | YB49 |

| position | YA2 | YA3 | YA4 | YA5 | A0 | A1 | state |
|---|---|---|---|---|---|---|---|
| A | ON | ON | OFF | OFF | 1 | 0 | keep current state |
| B | ON | ON | OFF | OFF | 1 | 1 | jump to next state |
| B | OFF | ON | ON | OFF | 0 | 1 | keep current state |
| C | OFF | ON | ON | OFF | 1 | 1 | jump to next state |
| C | OFF | OFF | ON | ON | 1 | 0 | keep current state |

OPTICAL ENCODER AND INTERPOLATION CIRCUIT AND OPERATING METHOD THEREOF

RELATED APPLICATION

The present application claims the benefit of U.S. Provisional Application No. 62/771,278, filed Nov. 26, 2018. The disclosure of the above listed application is hereby incorporated by references herein in its entirety.

BACKGROUND

1. Field of the Disclosure

This disclosure generally relates to an optical encoder and, more particularly, to an optical encoder and an interpolation circuit as well as an operating method thereof that have low consumption power, low silicon area and high positioning accuracy.

2. Description of the Related Art

Figure 1:
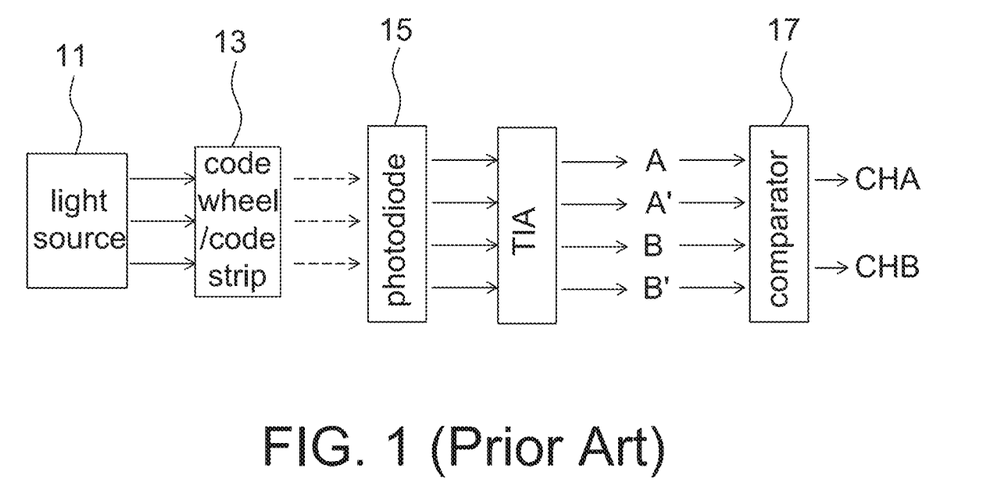
FIG. 1 is a block diagram of a conventional optical encoder.

Referring to FIG. 1, it is a block diagram of a conventional optical encoder that includes a light source 11, a code wheel (or code strip) 13, photodiodes 15 and a comparator 17. The photodiodes 15 detect light emitted from the light source 11 and passing the code wheel/strip 13 to output four signals A, A', B and B' sequentially having a 90 degrees phase shift via a trans-impedance amplifier (TIA). The comparator 17 compares the four signals A, A', B and B' to output two output signals CHA and CHB.

Figure 2:
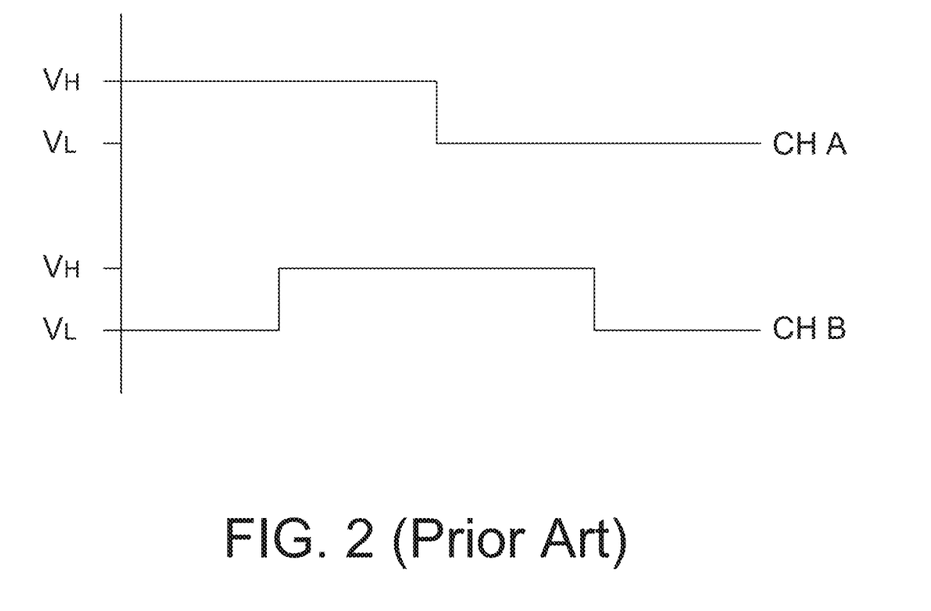
FIG. 2 is a schematic diagram of output signals of the optical encoder in FIG. 1.

FIG. 2 is a timing diagram of the output signals CHA and CHB. It is seen from FIG. 2 that voltage levels of the output signals CHA and CHB have four states within one period of the code wheel/strip 13. Accordingly, four positions of the code wheel/strip 13 can be indicated.

Figure 3:
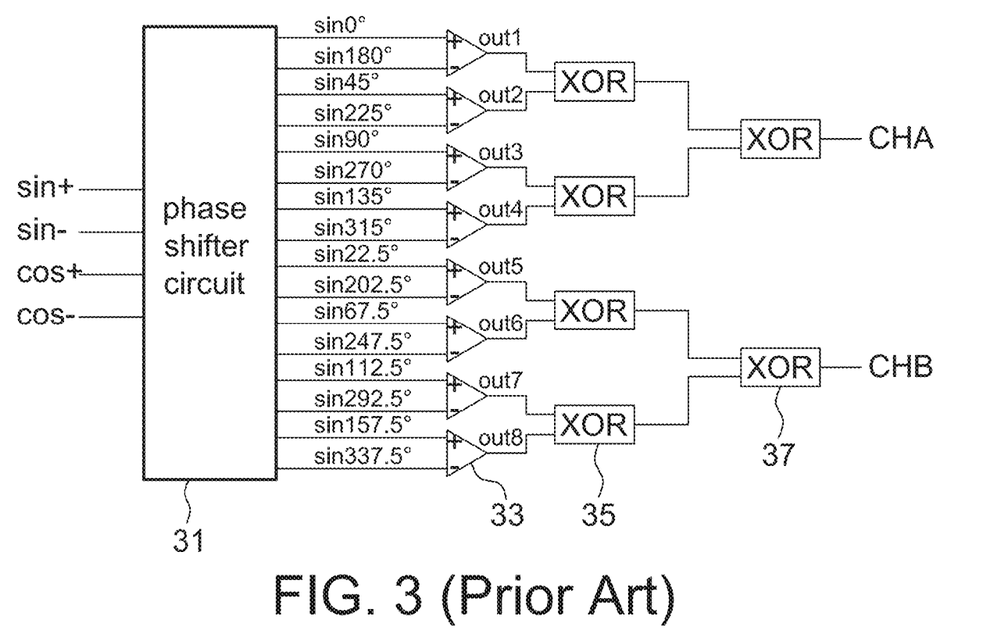
FIG. 3 is a schematic diagram of a conventional interpolation circuit of an optical encoder.
Figure 4:
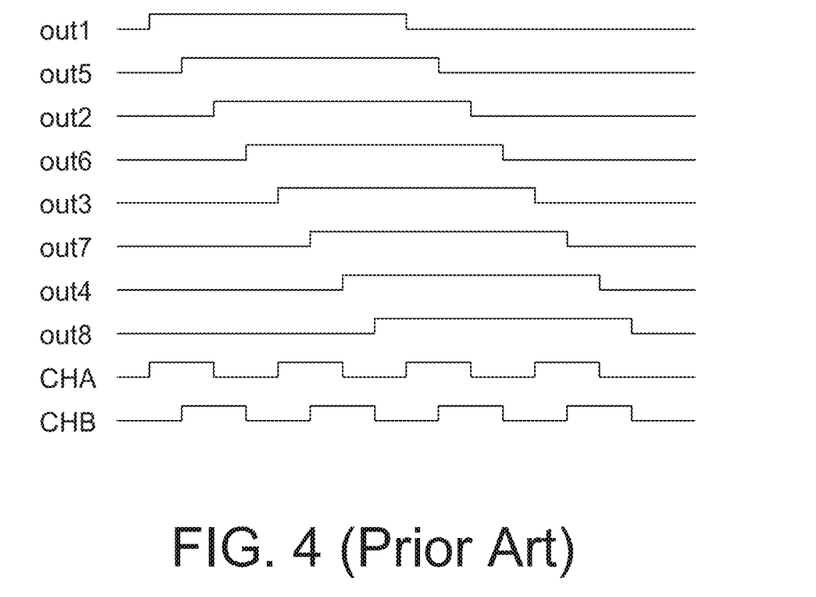
FIG. 4 is a timing diagram of signals of the interpolation circuit in FIG. 3.

However, to improve positioning accuracy, a combination of four signals is not enough. FIG. 3 shows a conventional 4-times interpolation circuit that includes a phase shifter circuit 31, multiple comparators 33, multiple first XOR gates 35 and multiple second XOR gates 37. FIG. 4 is a timing diagram of comparison signals out1 to out8 and output signals CHA and CHB in FIG. 3, it is seen from FIG. 4 that the output signals CHA and CHB can indicate 16 states within one period of the code wheel/strip 13, and thus 4-times positioning accuracy is achieved.

However, if higher positioning accuracy is required, more comparators will be used using the structure of FIG. 3. For example, if the interpolation factor is n, a number of 2n comparators are required. The increased comparators can increase the total power consumption and occupy a larger area, and the hysteresis mismatch of multiple comparators can also decrease the detection accuracy.

Accordingly, it is necessary to provide an optical encoder having a low silicon area, low consumption power and high accuracy.

SUMMARY

The present disclosure provides an optical encoder and an interpolation circuit as well as an operating method thereof that are suitable to be applied to a high interpolation factor. Because only four comparators are used, a small silicon area, low consumption power and high positioning accuracy are achieved.

The present disclosure provides an interpolation circuit of an optical encoder. The interpolation circuit includes a phase shifter circuit, a first multiplexer, a second multiplexer, a first comparator, a second comparator, a first digital circuit, a third comparator, a fourth comparator and a second digital circuit. The phase shifter circuit is configured to receive a first signal, a second signal, a third signal and a fourth signal sequentially having a 90-degrees phase shift, and output 4N phase shifted signals, wherein N is an interpolation factor. The first multiplexer is configured to receive 2N phase shifted signals among the 4N phase shifted signals from the phase shifter circuit. The second multiplexer is configured to receive the rest 2N phase shifted signals among the 4N phase shifted signals from the phase shifter circuit. The first comparator is configured to receive a first pair of phase shifted signals via the first multiplexer to generate a first comparison signal. The second comparator is configured to receive a second pair of phase shifted signals via the first multiplexer to generate a second comparison signal. The first digital circuit is configured to determine whether to change the first pair of phase shifted signals and the second pair of phase shifted signals, among the 2N phase shifted signals, respectively inputted into the first comparator and the second comparator according to the first and second comparison signals. The third comparator is configured to receive a third pair of phase shifted signals via the second multiplexer to generate a third comparison signal. The fourth comparator is configured to receive a fourth pair of phase shifted signals via the second multiplexer to generate a fourth comparison signal. The second digital circuit is configured to determine whether to change the third pair of phase shifted signals and the fourth pair of phase shifted signals, among the rest 2N phase shifted signals, respectively inputted into the third comparator and the fourth comparator according to the third and fourth comparison signals.

The present disclosure further provides an optical encoder including multiple photodiodes and an interpolation circuit. The multiple photodiodes are configured to receive modulated light to generate a first signal, a second signal, a third signal and a fourth signal sequentially having a 90-degrees phase shift. The interpolation circuit includes a phase shifter circuit, a first multiplexer, a second multiplexer, a first comparator, a second comparator, a third comparator and a fourth comparator. The phase shifter circuit is configured to output a number of 4N phase shifted signals according to the first signal, the second signal, the third signal and the fourth signal, wherein N is an interpolation factor. The first multiplexer and the second multiplexer are connected to the phase shifter circuit, and configured to receive the 4N phase shifted signals. The first comparator and the second comparator are configured to respectively receive a first pair of phase shifted signals and a second pair of phase shifted signals via the first multiplexer. The third comparator and the fourth comparator are configured to respectively receive a third pair of phase shifted signals and a fourth pair of phase shifted signals via the second multiplexer. A number of 2N phase shifted signals among the 4N phase shifted signals are selectively coupled to the first comparator and the second comparator by the first multiplexer, and the rest 2N phase shifted signals among the 4N phase shifted signals are selectively coupled to the third comparator and the fourth comparator by the second multiplexer.

The present disclosure further provides an operating method of an interpolation circuit of an optical encoder. The interpolation circuit includes a phase shifter circuit, a first multiplexer, a first comparator, a second comparator and a first digital circuit. The phase shifter circuit receives a first signal, a second signal, a third signal and a fourth signal sequentially having a 90-degrees phase shift and outputs a number of 4N phase shifted signals. The first multiplexer includes N/2 first switches and N/2 second switches. The operating method includes the steps of: conducting one of the N/2 first switches by the first digital circuit to cause the first comparator to receive a first pair of phase shifted signals and generate a first comparison signal; conducting one of the N/2 second switches by the first digital circuit to cause the second comparator to receive a second pair of phase shifted signals and generate a second comparison signal; comparing the first comparison signal and the second comparison signal; maintaining the first switch and the second switch that are currently being conducted to continuously conduct when the first comparison signal and the second comparison signal are different; and conducting a next first switch among the N/2 first switches or a next second switch among the N/2 second switches when the first comparison signal and the second comparison signal are identical.

In the embodiment of the present disclosure, the phase shifter circuit uses the resistor string to realize the phase shifting of input signals to generate different phase shifted signals. The resistors are scaled differently according to sine, cosine, arc sine and arc cosine functions.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The interpolation circuit of an optical encoder of the present disclosure does not need to increase the number of arranged comparators with the increasing of an interpolation factor. No matter how much the interpolation factor is required, only four comparators are used such that a lower silicon area is used and lower current is consumed. The present disclosure is especially suitable for the application requiring a high interpolation factor.

Figure 5:
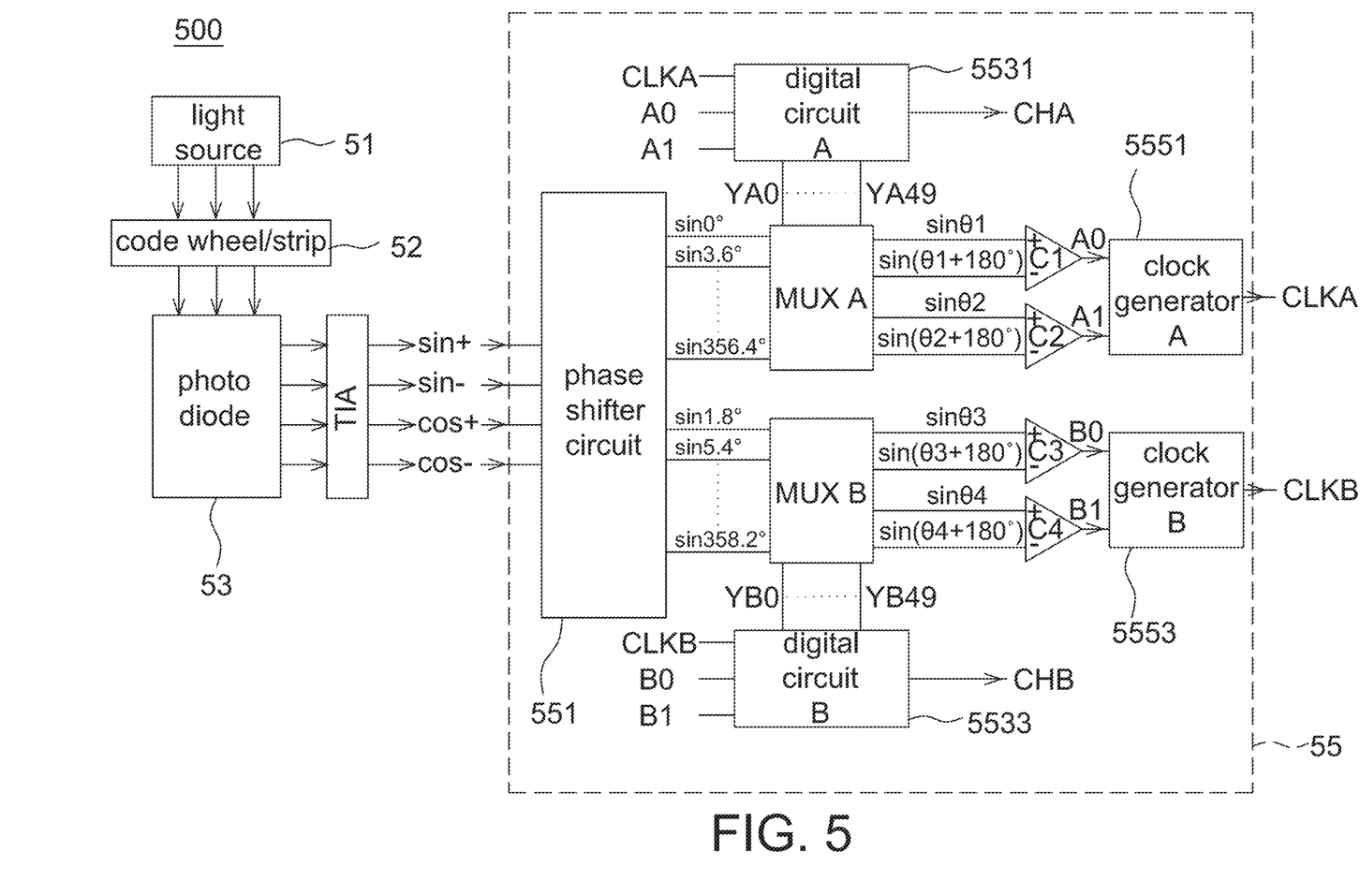
FIG. 5 is a block diagram of an optical encoder and an interpolation circuit thereof according to one embodiment of the present disclosure.

Referring to FIG. 5, it is a block diagram of an optical encoder 500 according to one embodiment of the present disclosure. The optical encoder 500 includes a light source 51, a code wheel (or code strip according to different applications) 52, multiple photodiodes 53 and an interpolation circuit 55.

The light source 51 is a coherent light source, a partially coherent light source or a non-coherent light source, and used to project emission light of an identifiable spectrum. The light source 51 is, for example, an infrared light emitting diode or an infrared laser diode, but not limited thereto.

The code wheel/strip 52 is a reflective type or a transmission type on which codes of a predetermined pattern are formed to perform the light modulation when the emission light is reflected thereby or passing therethrough. The code wheel/strip 52 performs a linear motion, a curve motion or a rotary motion according to different applications. When the code wheel/strip 52 has a relative displacement with respect to the light source 51, codes of the predetermined pattern thereon modulates the emission light.

Multiple photodiodes 53 are arranged corresponding to the code wheel/strip 52 to receive modulated light, e.g., formed by modulating the emission light. For example, when the code wheel/strip 52 is a reflective type, the light source 51 and the multiple photodiodes 53 are arranged at the same side of the code wheel/strip 52; whereas, when the code wheel/strip 52 is a transmission type, the light source 51 and the multiple photodiodes 53 are arranged at opposite sides of the code wheel/strip 52. After receiving the modulated emission light, the multiple photodiodes 53 generate a first signal sin+, a second signal cos+, a third signal sin− and a fourth signal cos− sequentially having a 90-degrees phase shift via a trans-impedance amplifier (TIA), wherein the first signal sin+ is a sine signal, the second signal cos+ is a cosine signal, the third signal sin− and the first signal sin+ are 180° output of phase, and the fourth signal cos− and the second signal cos+ are 180° output of phase. However, the present disclosure is not limited thereto. The operation of the TIA is known to the art and thus details thereof are not repeated herein.

In one non-limiting aspect, the optical encoder 500 further includes a signal processing circuit for processing output signals of the multiple photodiode 53 to generate ramp signals as the first signal, the second signal, the third signal and the fourth signal. Said ramp signals also have the above mentioned phase shifts.

The interpolation circuit 55 includes a phase shifter circuit 551, a first multiplexer MUXA, a second multiplexer MUXB, a first comparator C1, a second comparator C2, a third comparator C3, a fourth comparator C4, a first digital circuit 5531, a second digital circuit 5533, a first clock generator 5551 and a second clock generator 5553.

The phase shifter circuit 551 receives the first signal sin+, the second signal cos+, the third signal sin− and the fourth signal cos− sequentially having a 90-degrees phase shift to accordingly generate and output a number of 4N phase shifted signals, wherein N is an interpolation factor. In the present disclosure, N=50 is taken as an example for illustration purposes. The 4N phase shifted signals have a 360°/4N phase pitch, and amplitudes thereof change with time.

The first multiplexer MUXA and the second multiplexer MUXB are connected to the phase shifter circuit 551 to receive the 4N phase shifted signals. More specifically, the first multiplexer MUXA is used to receive a number of 2N phase shifted signals among the 4N phase shifted signals from the phase shifter circuit 551, wherein said 2N phase shifted signals have a 360°/2N phase pitch. The second multiplexer MUXB is used to receive the rest (different from those inputted into MUXA) 2N phase shifted signals among the 4N phase shifted signals from the phase shifter circuit 551, wherein said rest 2N phase shifted signals also have a 360°/2N phase pitch.

Figure 6:
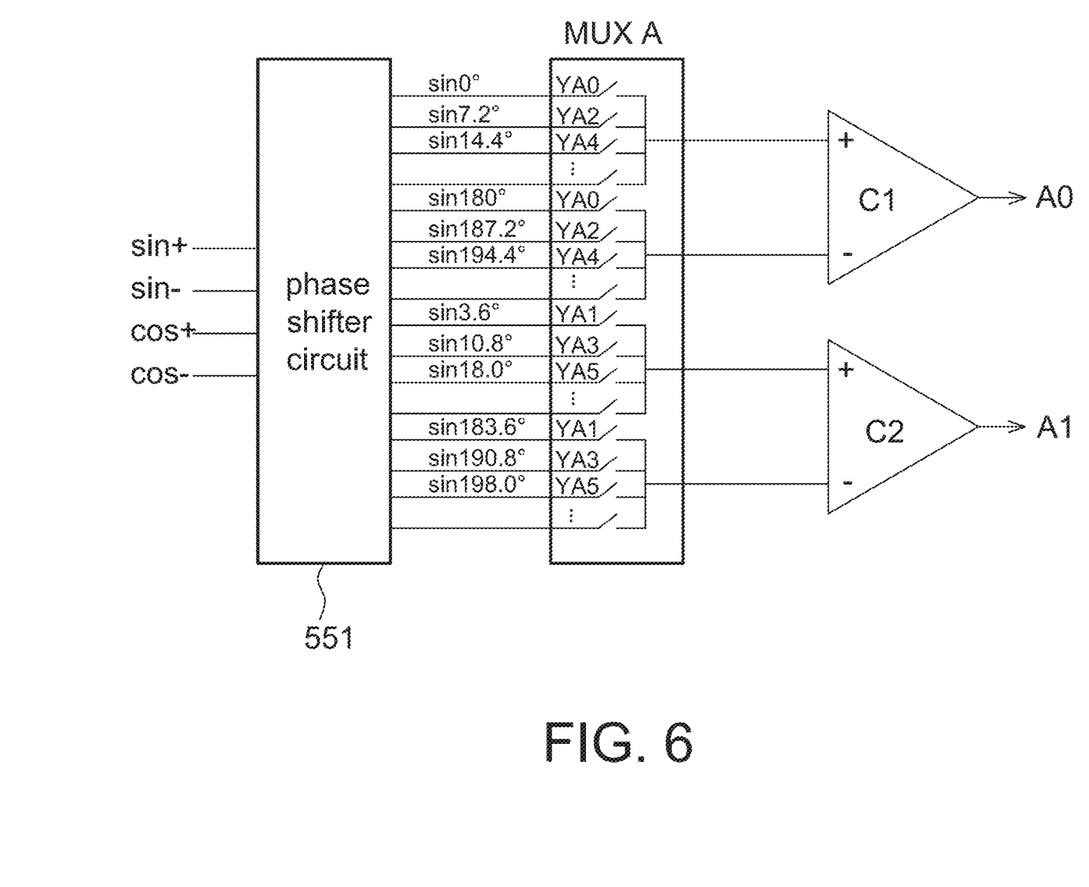
FIG. 6 is a schematic diagram of a multiplexer of an interpolation circuit of an optical encoder according to one embodiment of the present disclosure.

The first comparator C1 and the second comparator C2 are used to respectively receive a first pair of phase shifted signals and a second pair of phase shifted signals via the first multiplexer MUXA, illustrated by an example below. For example referring to FIG. 6, it is a schematic diagram of the first multiplexer MUXA of the interpolation circuit 55 of the optical encoder 500 according to one embodiment of the present disclosure. The first multiplexer MUXA includes, for example, a plurality of first switches (e.g., those coupled to the first comparator C1) and a plurality of second switches (e.g., those coupled to the second comparator C2).

Figure 7:
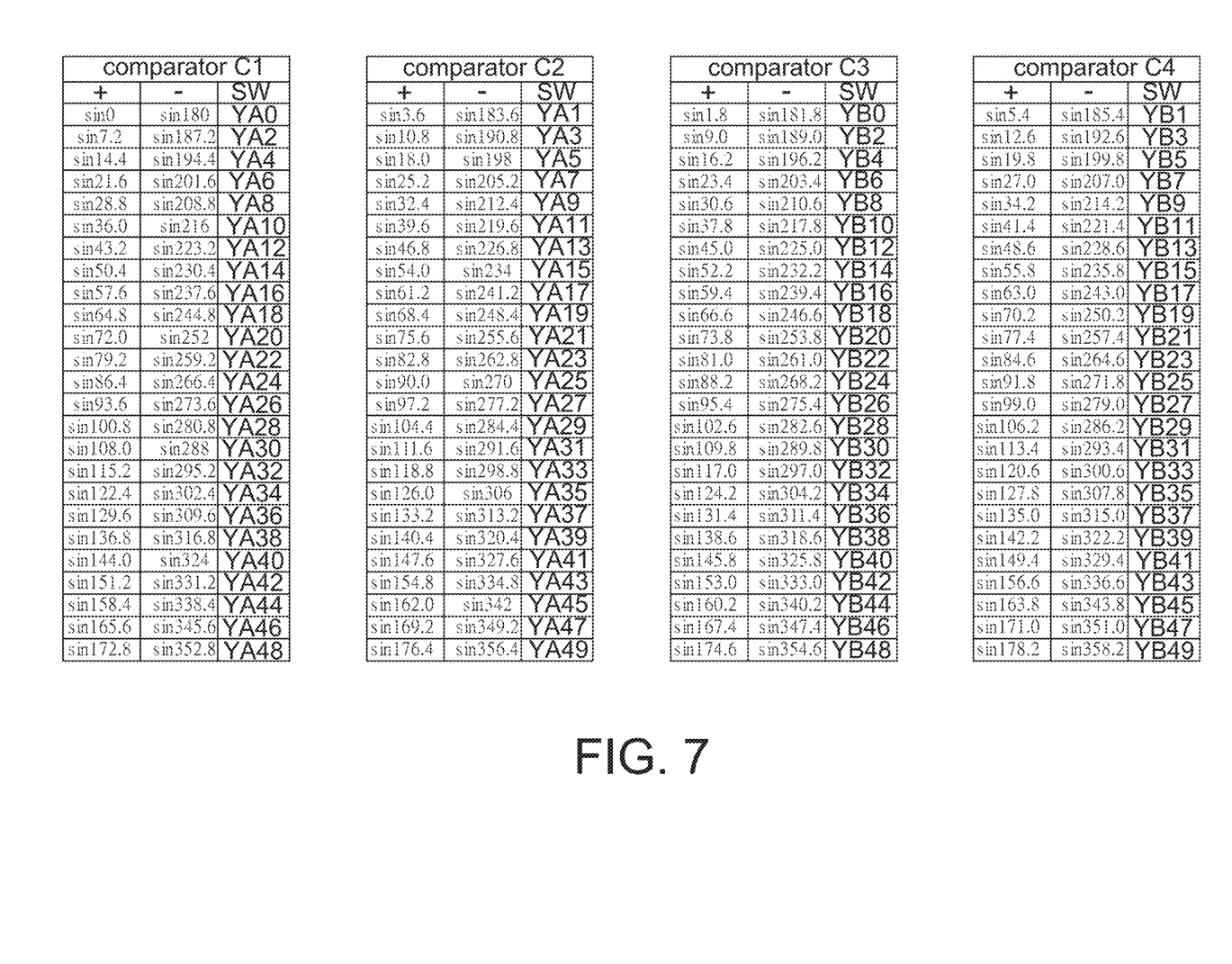
FIG. 7 show phase shifted signals inputted into different comparators of an interpolation circuit of an optical encoder according to one embodiment of the present disclosure.

The first comparator C1 is used to receive a first pair of phase shifted signals via a plurality of first switches YA0 to YA48 (as shown in FIG. 7) of the first multiplexer MUXA to generate a first comparison signal A0, e.g., signals sin 0° and sin 180° being sent to the first comparator C1 while the first switch YA0 is conducted, signals sin 7.2° and sin 187.2° being sent to the first comparator C1 while the first switch YA2 is conducted, and different first switches being conducted in a sequence of YA4, YA6 . . . . As shown in FIG. 7, the first pair of phase shifted signals are 180 degrees out of phase, and include $\sin\theta_1$ and $\sin(\theta_1+180°)$, where $\theta_1=4n\times360°/4N$ and n is an integer from 0 to (N/2)−1.

The second comparator C2 is used to receive a second pair of phase shifted signals via a plurality of second switches YA1 to YA49 (as shown in FIG. 7) of the first multiplexer MUXA to generate a second comparison signal A1, e.g., signals sin 3.6° and sin 183.6° being sent to the second comparator C2 while the second switch YA1 is conducted, signals sin 10.8° and sin 190.8° being sent to the second comparator C2 while the second switch YA3 is conducted, and different second switches being conducted in a sequence of YA5, YA7 . . . . As shown in FIG. 7, the second pair of phase shifted signals are 180 degrees out of phase, and respectively have a 360°×2/4N phase shift from the first pair of phase shifted signals. The second pair of phase shifted signals include $\sin\theta_2$ and $\sin(\theta_2+180°)$, where $\theta_2=(4n+2)\times360°/4N$ and n is an integer from 0 to (N/2)−1.

The third comparator C3 and the fourth comparator C4 are used to respectively receive a third pair of phase shifted signals and a fourth pair of phase shifted signals via the second multiplexer MUXB, illustrated by an example below. The second multiplexer MUXB is similar to the first multiplexer MUXA in FIG. 6, and include a plurality of third switches (e.g., those coupled to the third comparator C3) and a plurality of fourth switches (e.g., those coupled to the fourth comparator C4).

The third comparator C3 is used to receive a third pair of phase shifted signals via a plurality of third switches YB0 to YB48 (as shown in FIG. 7) of the second multiplexer MUXB to generate a third comparison signal B0, e.g., signals sin 1.8° and sin 181.8° being sent to the third comparator C3 while the third switch YB0 is conducted, signals sin 9.0° and sin 189.0° being sent to the third comparator C3 while the third switch YB2 is conducted, and different third switches being conduct in a sequence of YB4, YB6 . . . . As shown in FIG. 7, the third pair of phase shifted signals are 180 degrees out of phase, and respectively have a 360°/4N phase shift from the first pair of phase shifted signals. The third pair of phase shifted signals include $\sin\theta_3$ and $\sin(\theta_3+180°)$, where $\theta_3=(4n+1)\times360°/4N$ and n is an integer from 0 to (N/2)−1.

The fourth comparator C4 is used to receive a fourth pair of phase shifted signals via a plurality of fourth switches YB1 to YB49 (as shown in FIG. 7) of the second multiplexer MUXB to generate a fourth comparison signal B1, e.g., signals sin 5.4° and sin 185.4° being sent to the fourth comparator C4 while the second switch YB1 is conducted, signals sin 12.6° and sin 192.6° being sent to the fourth comparator C4 while the second switch YB3 is conducted, and different fourth switches being conducted in a sequence of YB5, YB7 . . . . As shown in FIG. 7, the fourth pair of phase shifted signals are 180 degrees out of phase, and respectively have a 360°×/4N phase shift from the first pair of phase shifted signals. The fourth pair of phase shifted signals include $\sin\theta_4$ and $\sin(\theta_4+180°)$, where $\theta_4=(4n+3)\times360°/4N$ and n is an integer from 0 to (N/2)−1.

In the present disclosure, voltage levels of the first comparison signal A0, the second comparison signal A1, the third comparison signal B0 and the fourth comparison signal B2 include a high level (e.g., indicated by a digit bit 1) and a low level (e.g., indicated by a digit bit 0).

More specifically, a number of 2N phase shifted signals (e.g., the first pair of phase shifted signals and the second pair of phase shifted signals) among the 4N phase shifted signals outputted from the phase shifter circuit 551 are selectively coupled to the first comparator C1 and the second comparator C2 via the first multiplexer MUXA; and the rest 2N phase shifted signals (e.g., the third pair of phase shifted signals and the fourth pair of phase shifted signals) among the 4N phase shifted signals outputted from the phase shifter circuit 551 are selectively coupled to the third comparator C3 and the fourth comparator C4 via the second multiplexer MUXB.

The first digital circuit 5531 is a state machine that is used to control the conducting of the plurality of first switches YA0 to YA48 and second switches) YA1 to YA49 of the first multiplexer MUXA to select the first pair of phase shifted signals and the second pair of phase shifted signals to be respectively sent to the first comparator C1 and the second comparator C2. More specifically, the first digital circuit 5531 is used to determine whether to change the first pair of phase shifted signals and the second pair of phase shifted signals, among the 2N phase shifted signals, respectively inputted into the first comparator C1 and the second comparator C2 according to the first comparison signal A0 and the second comparison signal A1.

Figure 8:
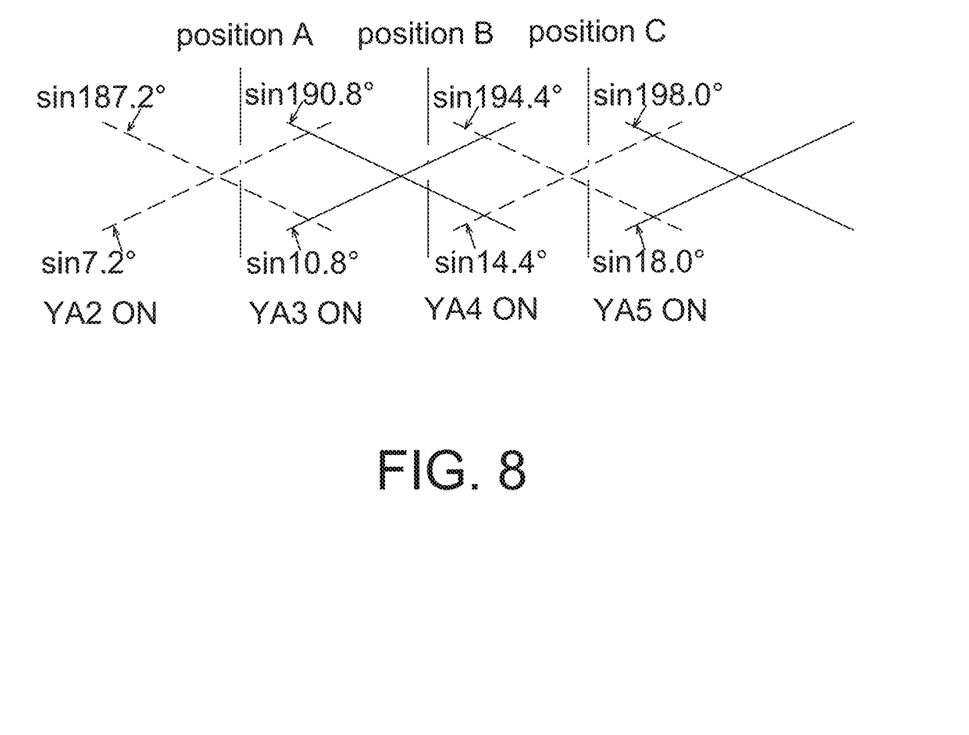
FIG. 8 is an operational schematic diagram of an interpolation circuit of an optical encoder according to one embodiment of the present disclosure.
Figure 9:
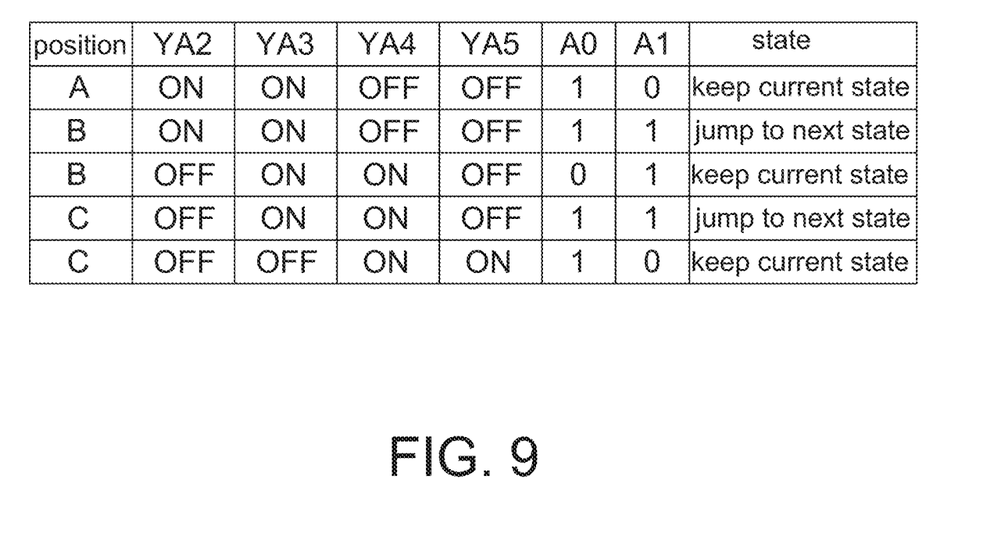
FIG. 9 shows operating states of the interpolation circuit of an optical encoder in FIG. 8.

For example referring to FIGS. 8 and 9, it is assumed that the code wheel/strip 52 currently locates at a position A, and the first switch YA2 and the second switch YA3 are conducted. In this scenario, the phase shifted signal sin 7.2° is inputted into a positive input of the first comparator C1 and the phase shifted signal sin 187.2° is inputted into a negative input of the first comparator C1. As the amplitude of sin 7.2° is larger than the amplitude of sin 187.2° (referring to FIG. 8) at position A, the first comparison signal A0 outputted by the first comparator C1 is a high voltage level (e.g., indicated as A0=1 in FIG. 9). Meanwhile, the phase shifted signal sin 10.8° is inputted into a positive input of the second comparator C2 and the phase shifted signal sin 190.8° is inputted into a negative input of the second comparator C2. As the amplitude of sin 190.8° is smaller than the amplitude of sin 190.8° (referring to FIG. 8) at position A, the second comparison signal A1 outputted by the second comparator C2 is a low voltage level (e.g., indicated as A1=0 in FIG. 9). In the present disclosure, when voltage levels of the comparison signals outputted by the first comparator C1 and the second comparator C2 are different, it means that a correct current position is obtained, and thus the first digital circuit 5531 maintains the current state without changing the conducting state of the first switch and the second switch.

When the code wheel/strip 52 changes its current position from A to B, and if the first digital circuit 5531 still conducts the first switch YA2 and the second switch YA3, the comparison signals outputted from the first comparator C1 and the second comparator C2 both have high voltage levels (the second row in FIG. 9 indicating A0A1=11) using the above mentioned method. In the present disclosure, when voltage levels of the comparison signals outputted by the first comparator C1 and the second comparator C2 are identical, it means that a correct position is not obtained, and thus the first digital circuit 5531 changes the conducting state of the plurality of first switches and the plurality of second switches to enter a next state and confirms the voltage levels of the comparison signals outputted by the first comparator C1 and the second comparator C2 again.

For example, the first digital circuit 5531 turns off the first switch YA2 and turns on the next first switch YA4 to cause the phase shifted signal sin 14.4° to be inputted into the positive input of the first comparator C1 and the phase shifted signal sin 194.4° to be inputted into the negative input of the first comparator C1. As the amplitude of sin 14.4° is smaller than the amplitude of sin 194.4° (referring to FIG. 8) at position B, the first comparison signal A0 outputted by the first comparator C1 is a low voltage level (e.g., the third row of FIG. 9 indicating as A0=0). Meanwhile, as the second switch YA3 is still conducted and the amplitude of sin 10.8° is larger than the amplitude of sin 190.8° at position B, the second comparison signal A1 outputted by the second comparator C2 is a high voltage level (e.g., the third row of FIG. 9 indicating as A1=1). Accordingly, the first digital circuit 5531 identifies that a correct current position is obtained and thus the current state is maintained.

Using the above mentioned method, the first digital circuit 5531 sequentially turns on only the switch group YA2 and YA3, the switch group YA3 and YA4, the switch group YA4 and YA5 and so on. When the first digital circuit 5531 or a processor including the first digital circuit 5531 identifies that voltage levels of the comparison signals outputted by the first comparator C1 and the second comparator C2 are different, a current position is confirmed.

More specifically, in the embodiment of FIGS. 8 and 9, when the first comparison signal A0 outputted by the first comparator C1 and the second comparison signal A1 outputted by the second comparator C2 have different voltage levels (01 or 10), the first digital circuit 5531 does not change the first pair of phase shifted signals and the second pair of phase shifted signals, among the 2N phase shifted signals, respectively inputted into the first comparator C1 and the second comparator C2 (i.e. a current state being maintained); whereas, when the first comparison signal A0 outputted by the first comparator C1 and the second comparison signal A1 outputted by the second comparator C2 have identical voltage levels (00 or 11), the first digital circuit 5531 changes the first pair of phase shifted signals and the second pair of phase shifted signals, among the 2N phase shifted signals, respectively inputted into the first comparator C1 and the second comparator C2.

The second digital circuit 5533 is also a state machine that is used to control the conducting of the plurality of third switches YB0 to YB48 and fourth switches YB1 to YB49 of the second multiplexer MUXB to select the third pair of phase shifted signals and the fourth pair of phase shifted signals to be respectively sent to the third comparator C3 and the fourth comparator C4. More specifically, the second digital circuit 5533 is used to determine whether to change the third pair of phase shifted signals and the fourth pair of phase shifted signals, among the rest 2N phase shifted signals, respectively inputted into the third comparator C3 and the fourth comparator C4 according to the third comparison signal B0 and the fourth comparison signal B1.

The operation of the second digital circuit 5533 is similar to that of the first digital circuit 5531 mentioned above, only the multiplexer and phase shifted signals to be controlled are different. A person of ordinary skill in the art would understand the operation of the second digital circuit 5533 after understanding the operation of the first digital circuit 5531. In brief, when the third comparison signal B0 and the fourth comparison signal B1 have different voltage levels, the second digital circuit 5533 does not change the third pair of phase shifted signals and the fourth pair of phase shifted signals, among the rest 2N phase shifted signals, respectively inputted into the third comparator C3 and the fourth comparator C4; whereas, when the third comparison signal B0 and the fourth comparison signal B1 have identical voltage levels, the second digital circuit 5533 changes the third pair of phase shifted signals and the fourth pair of phase shifted signals, among the rest 2N phase shifted signals, respectively inputted into the third comparator C3 and the fourth comparator C4.

The first digital circuit 5531 and the second digital circuit 5533 are, for example, included in a digital signal processor (DSP) or an application specific integrated circuit (ASIC), and implemented by software and/or hardware.

Figure 11:
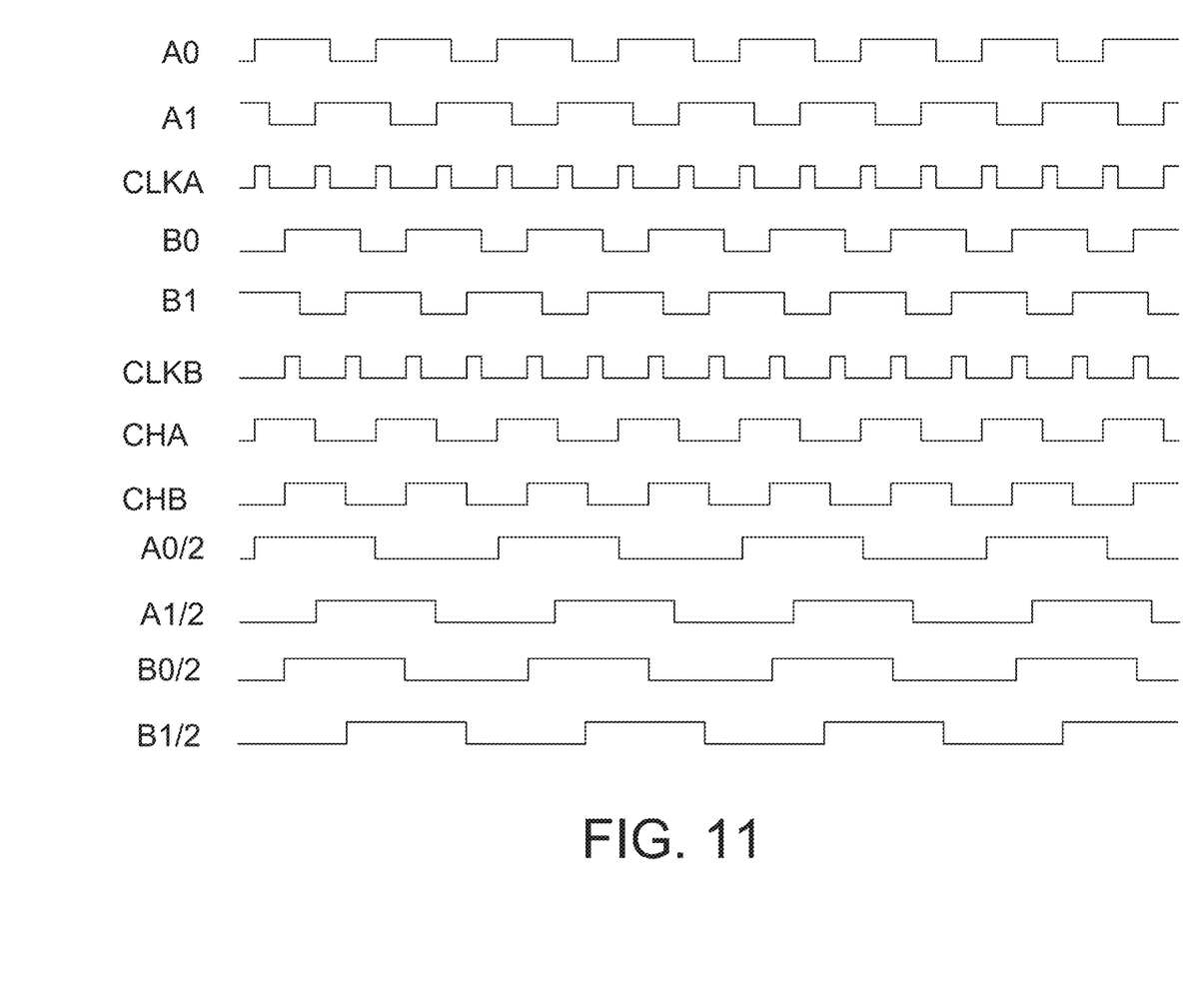
FIG. 11 is a timing diagram of signals of the interpolation circuit of an optical encoder in FIG. 5.

The first clock generator 5551 is used to generate a first clock signal CLKA to the first digital circuit 5531, and the second clock generator 5553 is used to generate a second clock signal CLKB to the second digital circuit 5533. The relationship between the first clock signal CLKA, the second clock signal CLKB and the comparison signals A0, A1, B0 and B1 are shown in FIG. 11. The output signal CHA is obtained by (A0/2) XOR (A1/2) as shown in FIG. 11. The output signal CHB is obtained by (B0/2) XOR (B1/2) as shown in FIG. 11.

Figure 10:
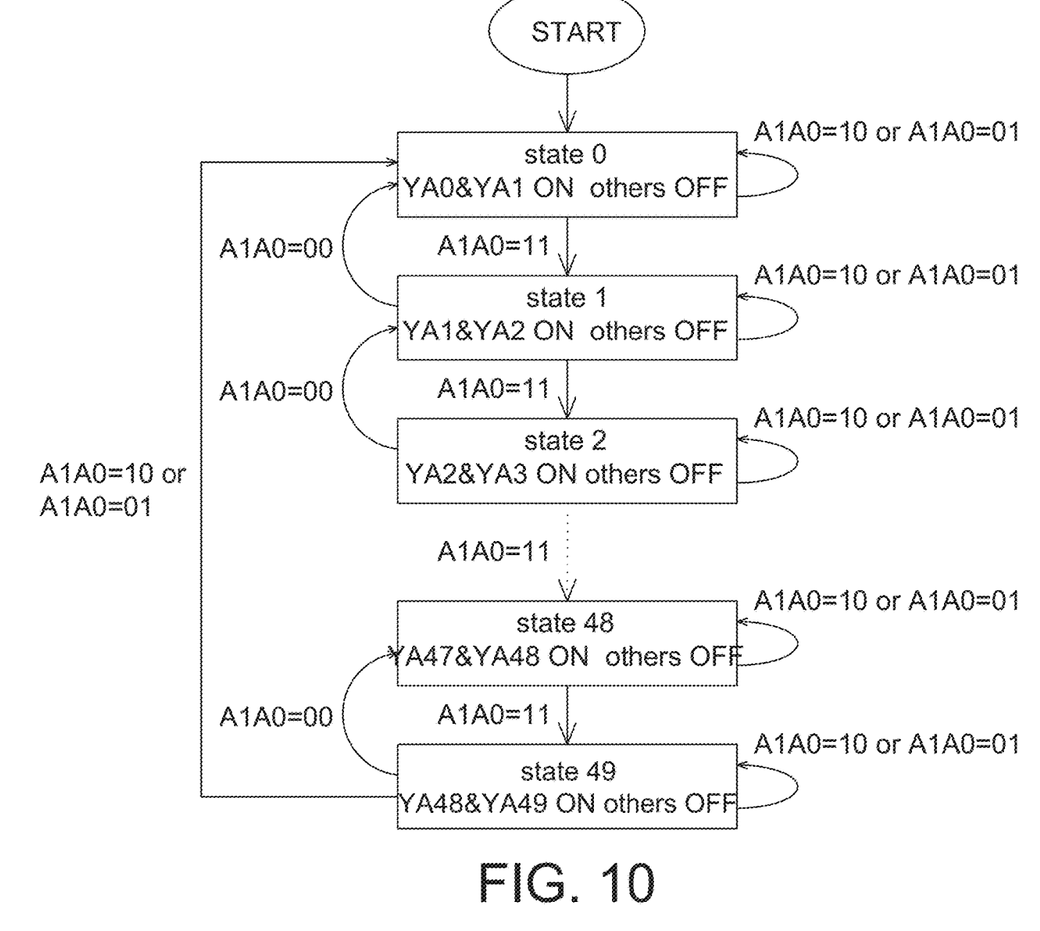
FIG. 10 is a flow chart of an operating method of an interpolation circuit of an optical encoder according to one embodiment of the present disclosure.

Referring to FIG. 10, the present disclosure further provides an operating method of an interpolation circuit of an optical encoder applicable to the interpolation circuit 55 of FIG. 5. As mentioned above, the phase shifter circuit 551 receives a first signal sin+, a second signal cos+, a third signal sin− and a fourth signal sin− sequentially have a 90 degrees phase shift, and outputs a number of 4N phase shifted signals. The first multiplexer MUXA includes a number of N/2 first switches YA0 to YA 48 and a number of N/2 second switches YA1 to YA49. The second multiplexer MUXB includes a number of N/2 third switches YB0 to YB48 and a number of N/2 fourth switches YB1 to YB49.

The operating method of this embodiment includes the steps of: conducting one of the N/2 first switches YA0 to YA48 by the first digital circuit 5531 to cause the first comparator C1 to receive a first pair of phase shifted signals and generate a first comparison signal A0; conducting one of the N/2 second switches YA1 to YA49 by the first digital circuit 5531 to cause the second comparator C2 to receive a second pair of phase shifted signals and generate a second comparison signal A1. Next, the first digital circuit 5531 or a processor including the first digital circuit 5531 compares the first comparison signal A0 and the second comparison signal A1; maintains the first switch and the second switch that are currently being conducted to continuously conduct when the first comparison signal A0 and the second comparison signal A1 are different; and conduct a next first switch among the N/2 first switches or a next second switch among the N/2 second switches when the first comparison signal A0 and the second comparison signal A1 are identical.

According to FIG. 10, the first digital circuit 5531 conducts the first switch and the second switch associated with the first pair of phase shifted signals $\sin(4n \times 360°/4N)$ and $\sin(4n \times 360°/4N+180°)$ and the second pair of phase shifted signals $\sin((4n+2) \times 360°/4N)$ and $\sin((4n+2) \times 360°/4N+180°)$ in a sequence of n=0, 1, 2 to (N/2)−1. For example, in the start of this operating method, a state 0 is entered. Meanwhile, the first digital circuit 5531 turns on the first switch YA0 and the second switch YA1, which correspond to n=0, such that signals sin 0° and sin 180° are sent to the first comparator C1 as well as signals sin 3.6° and sin 183.6° are sent to the second comparator C2. When voltage levels of the comparison signals of the first comparator C1 and the second comparator C2 are different (FIG. 10 showing A1A0=10 or 01), the state 0 is maintained; otherwise, a state 1 is entered.

In the state 1, the first digital circuit 5531 turns on the first switch YA2, which corresponds to n=1, to cause signals sin 7.2° and sin 187.2° to be sent to the first comparator C1, and turns on the second switch YA1, which corresponds to n=0, to cause signals sin 3.6° and sin 183.6° to be sent to the second comparator C2. Similarly, when voltage levels of the comparison signals of the first comparator C1 and the second comparator C2 are different, the state 1 is maintained; when the voltage levels of the comparison signals of the first comparator C1 and the second comparator C2 are both 1, a state 2 is entered; otherwise when the voltage levels of the comparison signals of the first comparator C1 and the second comparator C2 are both 0, the state 0 is returned.

In this way, the first digital circuit 5531 controls a plurality of first switches and a plurality of second switches to enter different states to confirm a current position. The first digital circuit 5531 totally determines a number of N states.

The operating method of the present disclosure further includes the steps of: conducting one of the N/2 third switches YB0 to YB48 by the second digital circuit 5533 to cause the third comparator C3 to receive a third pair of phase shifted signals and generate a third comparison signal B0; conducting one of the N/2 fourth switches YB1 to YB49 by the second digital circuit 5533 to cause the fourth comparator C4 to receive a fourth pair of phase shifted signals and generate a fourth comparison signal B1. Next, the second digital circuit 5533 or a processor including the second digital circuit 5533 compares the third comparison signal B0 and the fourth comparison signal B1; maintains the third switch and the fourth switch that are currently being conducted to continuously conduct when the third comparison signal B0 and the fourth comparison signal B1 are different; and conducting a next third switch among the N/2 third switches or a next fourth switch among the N/2 fourth switches when the third comparison signal B0 and the fourth comparison signal B1 are identical.

The second digital circuit 5533 also conducts the third switch and the fourth switch associated with the third pair of phase shifted signals $\sin(4n+1) \times 360°/ \times 360°/4N$ and $\sin((4n+3) \times 360°/4N+180°)$ in a sequence of n=0, 1, 2 to (N/2)−1 to confirm the operating state of the second digital circuit 5533 (as shown in FIG. 10) to accordingly confirm a current position of the code wheel/strip 52. The second digital circuit 5533 also totally determines a number of N states.

The method of the second digital circuit 5533 for controlling the second multiplexer MUXB and the plurality of third switches YB0 to YB48 as well as the plurality of fourth switches YB1 to YB40 are similar to the operation of the first digital circuit 5531, and a person of ordinary skill in the art would understand the operation of the second digital circuit 5533 after understanding the operation of the first digital circuit 5531.

The position obtained according to FIG. 10 is a relative position (which is determined according the states of MUXA and MUXB). If it is desired to obtain an absolute position, the phase shifter circuit 551 further outputs an index signal as a reference, and as it is not a main objective of the present disclosure, details thereof are not described herein.

It is appreciated that every value, such as the shifted phase and the interpolation factor herein is only intended to illustrate but not to limit the present disclosure.

It should be mentioned that although in one pair of phase shifted signals inputted into a comparator mentioned above, a smaller phase signal is inputted into a positive input of the comparator and a larger phase signal is inputted to a negative input of the comparator, it is only intended to illustrate but not to limit the present disclosure. In other embodiments, the smaller phase signal is arranged to be inputted into the negative input of the comparator and the larger phase signal is inputted to the positive input of the comparator, and high and low levels of the comparison signals in FIG. 11 are exchanged.

Taking the 50-times interpolation circuit of the present disclosure as an example, although the interpolation circuit 55 of the present disclosure further adopts multiplexers and digital circuits compared with the conventional circuit of FIG. 3, in the 0.25 micrometer manufacturing process, 70% of silicon area is saved and the consuming current is about 1/16 of the conventional circuit of FIG. 3 since only four comparators are used in the present disclosure. Significant improvement is achieved.

As mentioned above, the conventional interpolation circuit of an optical encoder has to use a large amount of comparators if a high interpolation factor is required such that high electrical power is consumed, larger silicon area is used and the positioning accuracy is degraded. Accordingly, the present disclosure further provides an optical encoder and an interpolation circuit (e.g., FIG. 5) as well as an operating method thereof (e.g., FIG. 10) that use only four comparators in conjunction with two multiplexers for selecting phase shifted signals inputted into the four comparators to determine a current position according to a state number of two state machines.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An interpolation circuit of an optical encoder, the interpolation circuit comprising:
   a phase shifter circuit configured to receive a first signal, a second signal, a third signal and a fourth signal sequentially having a 90-degrees phase shift, and output 4N phase shifted signals, wherein N is an interpolation factor;
a first multiplexer configured to receive 2N phase shifted signals among the 4N phase shifted signals from the phase shifter circuit;
a second multiplexer configured to receive the rest 2N phase shifted signals among the 4N phase shifted signals from the phase shifter circuit;
a first comparator configured to receive a first pair of phase shifted signals via the first multiplexer to generate a first comparison signal;
a second comparator configured to receive a second pair of phase shifted signals via the first multiplexer to generate a second comparison signal;
a first digital circuit configured to determine whether to change the first pair of phase shifted signals and the second pair of phase shifted signals, among the 2N phase shifted signals, respectively inputted into the first comparator and the second comparator according to the first and second comparison signals;
a third comparator configured to receive a third pair of phase shifted signals via the second multiplexer to generate a third comparison signal;
a fourth comparator configured to receive a fourth pair of phase shifted signals via the second multiplexer to generate a fourth comparison signal; and
a second digital circuit configured to determine whether to change the third pair of phase shifted signals and the fourth pair of phase shifted signals, among the rest 2N phase shifted signals, respectively inputted into the third comparator and the fourth comparator according to the third and fourth comparison signals.

2. The interpolation circuit as claimed in claim 1, wherein the first signal is a sine signal, the second signal is a cosine signal, the third signal and the first signal are 180 degrees output of phase, and the fourth signal and the second signal are 180 degrees output of phase.

3. The interpolation circuit as claimed in claim 1, wherein
when the first comparison signal and the second comparison have different voltage levels, the first digital circuit is configured to not change the first pair of phase shifted signals and the second pair of phase shifted signals, among the 2N phase shifted signals, respectively inputted into the first comparator and the second comparator, and
when the first comparison signal and the second comparison have identical voltage levels, the first digital circuit is configured to change the first pair of phase shifted signals and the second pair of phase shifted signals, among the 2N phase shifted signals, respectively inputted into the first comparator and the second comparator.

4. The interpolation circuit as claimed in claim 1, wherein
when the third comparison signal and the fourth comparison signal have different voltage levels, the second digital circuit is configured to not change the third pair of phase shifted signals and the fourth pair of phase shifted signals, among the rest 2N phase shifted signals, respectively inputted into the third comparator and the fourth comparator, and
when the third comparison signal and the fourth comparison signal have identical voltage levels, the second digital circuit is configured to change the third pair of phase shifted signals and the fourth pair of phase shifted signals, among the rest 2N phase shifted signals, respectively inputted into the third comparator and the fourth comparator.

5. The interpolation circuit as claimed in claim 1, wherein
the first pair of phase shifted signals are 180 degrees out of phase,
the second pair of phase shifted signals respectively have a 360°×2/4N phase shift from the first pair of phase shifted signals,
the third pair of phase shifted signals respectively have a 360°/4N phase shift from the first pair of phase shifted signals, and
the fourth pair of phase shifted signals respectively have a 360°×3/4N phase shift from the first pair of phase shifted signals.

6. The interpolation circuit as claimed in claim 5, wherein the first pair of phase shifted signals include sin θ1 and sin(θ1+180°), wherein θ1=4n×360°/4N and n is an integer from 0 to (N/2)−1.

7. The interpolation circuit as claimed in claim 1, further comprising:
a first clock generator configured to generate a first clock signal to the first digital circuit, and
a second clock generator configured to generate a second clock signal to the second digital circuit.

8. The interpolation circuit as claimed in claim 1, wherein the first signal, the second signal, the third signal and the fourth signal are ramp signals.

9. An optical encoder, comprising:
multiple photodiodes configured to receive modulated light to generate a first signal, a second signal, a third signal and a fourth signal sequentially having a 90-degrees phase shift; and
an interpolation circuit, comprising:
a phase shifter circuit configured to output 4N phase shifted signals according to the first signal, the second signal, the third signal and the fourth signal, wherein N is an interpolation factor;
a first multiplexer and a second multiplexer connected to the phase shifter circuit, and configured to receive the 4N phase shifted signals;
a first comparator and a second comparator configured to respectively receive a first pair of phase shifted signals and a second pair of phase shifted signals via the first multiplexer; and
a third comparator and a fourth comparator configured to respectively receive a third pair of phase shifted signals and a fourth pair of phase shifted signals via the second multiplexer,
wherein 2N phase shifted signals among the 4N phase shifted signals are selectively coupled to the first comparator and the second comparator by the first multiplexer, and the rest 2N phase shifted signals among the 4N phase shifted signals are selectively coupled to the third comparator and the fourth comparator by the second multiplexer.

10. The optical encoder as claimed in claim 9, further comprising:
a first digital circuit configured to control switches of the first multiplexer to conduct to select the first pair of phase shifted signals and the second pair of phase shifted signals from the 2N phase shifted signals; and
a second digital circuit configured to control switches of the second multiplexer to conduct to select the third pair of phase shifted signals and the fourth pair of phase shifted signals from the rest 2N phase shifted signals.

11. The optical encoder as claimed in claim 9, wherein the first signal is a sine signal, the second signal is a cosine signal, the third signal and the first signal are 180 degrees output of phase, and the fourth signal and the second signal are 180 degrees output of phase.

12. The optical encoder as claimed in claim 9, wherein
the first pair of phase shifted signals are 180 degrees out of phase,
the second pair of phase shifted signals respectively have a 360°×2/4N phase shift from the first pair of phase shifted signals,
the third pair of phase shifted signals respectively have a 360°/4N phase shift from the first pair of phase shifted signals, and
the fourth pair of phase shifted signals respectively have a 360°×3/4N phase shift from the first pair of phase shifted signals.

13. The optical encoder as claimed in claim 12, wherein the first pair of phase shifted signals include sin θ1 and sin(θ1+180°), wherein θ1=4n×360°/4N and n is an integer from 0 to (N/2)−1.

14. The optical encoder as claimed in claim 9, wherein the first signal, the second signal, the third signal and the fourth signal are ramp signals.

15. An operating method of an interpolation circuit of an optical encoder, the interpolation circuit comprising a phase shifter circuit, a first multiplexer, a first comparator, a second comparator and a first digital circuit, the phase shifter circuit receiving a first signal, a second signal, a third signal and a fourth signal sequentially having a 90-degrees phase shift and outputting 4N phase shifted signals, the first multiplexer comprising N/2 first switches and N/2 second switches, the operating method comprising:
conducting one of the N/2 first switches by the first digital circuit to cause the first comparator to receive a first pair of phase shifted signals and generate a first comparison signal;
conducting one of the N/2 second switches by the first digital circuit to cause the second comparator to receive a second pair of phase shifted signals and generate a second comparison signal;
comparing the first comparison signal and the second comparison signal;
maintaining the first switch and the second switch that are currently being conducted to continuously conduct when the first comparison signal and the second comparison signal are different; and
conducting a next first switch among the N/2 first switches or a next second switch among the N/2 second switches when the first comparison signal and the second comparison signal are identical.

16. The operating method as claimed in claim 15, wherein
the first pair of phase shifted signals include sin θ1 and sin(θ1+180°), θ1=4n×360°/4N, and
the second pair of phase shifted signals include sin θ2 and sin(θ2+180°), θ2=(4n+2)×360°/4N, wherein n is an integer from 0 to (N/2)−1.

17. The operating method as claimed in claim 16, wherein the first digital circuit conducts the first switch and the second switch associated with the first pair of phase shifted signals and the second pair of phase shifted signals in a sequence of n=0, 1, 2 to (N/2)−1.

18. The operating method as claimed in claim 15, wherein the interpolation circuit further comprises a second multiplexer, a third comparator, a fourth comparator and a second digital circuit, the second multiplexer comprises N/2 third switches and N/2 fourth switches, and the operating method further comprises:
conducting one of the N/2 third switches by the second digital circuit to cause the third comparator to receive a third pair of phase shifted signals and generate a third comparison signal;
conducting one of the N/2 fourth switches by the second digital circuit to cause the fourth comparator to receive a fourth pair of phase shifted signals and generate a fourth comparison signal;
comparing the third comparison signal and the fourth comparison signal;
maintaining the third switch and the fourth switch that are currently being conducted to continuously conduct when the third comparison signal and the fourth comparison signal are different; and
conducting a next third switch among the N/2 third switches or a next fourth switch among the N/2 fourth switches when the third comparison signal and the fourth comparison signal are identical.

19. The operating method as claimed in claim 18, wherein
the third pair of phase shifted signals include sin θ3 and sin(θ3+180°), θ3=(4n+1)×360°/4N, and
the fourth pair of phase shifted signals include sin θ4 and sin(θ4+180°), θ4=(4n+3)×360°/4N, wherein n is an integer from 0 to (N/2)−1.

20. The operating method as claimed in claim 19, wherein the second digital circuit conducts the third switch and the fourth switch associated with the third pair of phase shifted signals and the fourth pair of phase shifted signals in a sequence of n=0, 1, 2 to (N/2)−1.

* * * * *